(12) United States Patent
Lim

(10) Patent No.: US 7,615,131 B2
(45) Date of Patent: Nov. 10, 2009

(54) PLASMA ETCHING CHAMBER AND PLASMA ETCHING SYSTEM USING SAME

(75) Inventor: Dong-Soo Lim, Ichon-si (KR)

(73) Assignee: SOSUL Co., Ltd., Kyungki-do (KR)

( * ) Notice: Subject to any disclaimer, the term of this patent is extended or adjusted under 35 U.S.C. 154(b) by 331 days.

(21) Appl. No.: 10/514,609

(22) PCT Filed: Nov. 18, 2003

(86) PCT No.: PCT/KR03/02478

§ 371 (c)(1),
(2), (4) Date: Nov. 16, 2004

(87) PCT Pub. No.: WO2004/100247

PCT Pub. Date: Nov. 18, 2004

(65) Prior Publication Data

US 2005/0173067 A1     Aug. 11, 2005

(30) Foreign Application Priority Data

May 12, 2003   (KR) .................. 10-2003-0029783

(51) Int. Cl.
*C23F 1/00*  (2006.01)
*H01L 21/306*  (2006.01)
*C23C 16/00*  (2006.01)
(52) U.S. Cl. ................ 156/345.43; 118/723 E
(58) Field of Classification Search ............ 156/345.43
See application file for complete search history.

(56) References Cited

U.S. PATENT DOCUMENTS 5,848,670 A * 12/1998 Salzman ................ 187/272

6,004,631 A    12/1999 Mori
6,146,463 A *  11/2000 Yudovsky et al. ........... 118/729
6,758,941 B1 * 7/2004 Ookawa et al. ........ 156/345.47

(Continued)

FOREIGN PATENT DOCUMENTS

EP       0 810 641       5/1997

(Continued)

*Primary Examiner*—Parviz Hassanzadeh
*Assistant Examiner*—Maureen Gramaglia
(74) *Attorney, Agent, or Firm*—Fish & Richardson P.C.

(57) ABSTRACT

Disclosed is a plasma etching chamber for completely dry-cleaning a film material and particles deposited at the periphery of a wafer through plasma etching while generating plasma at the top to the bottom sides of the periphery of the wafer. A pair of top and bottom anodes facing each other is placed around the periphery of the wafer under the application of radio frequency through a cathode. Alternatively, a top cathode and a bottom anode are placed around the periphery of the wafer while facing each other and a view-ring shields the area of the cathode, the anode and the wafer from the outside. A plasma etching system includes a plurality of the above-structured etching chambers. A handler takes wafers from a plurality of cassette stands or load ports, and posture-corrects the orientation frat locations of the wafers by a wafer alignment unit. The wafers are charged into the plasma etching chambers directly or via load lock chambers. The handler takes the etched wafers from the chambers, and returns the wafers to the cassettes or the load ports directly or via the load lock chambers.

20 Claims, 10 Drawing Sheets

U.S. PATENT DOCUMENTS

| | | | |
|---|---|---|---|
| 6,770,166 B1 * | 8/2004 | Fischer | 156/345.47 |
| 2005/0178505 A1 * | 8/2005 | Kim | 156/345.47 |

FOREIGN PATENT DOCUMENTS

| | | |
|---|---|---|
| EP | 0810641 | 12/1997 |
| JP | 07-142449 | 6/1995 |
| JP | 2002-324829 | 11/2002 |

* cited by examiner

PLASMA ETCHING CHAMBER AND PLASMA ETCHING SYSTEM USING SAME

BACKGROUND OF THE INVENTION (a) Field of the Invention

The present invention relates to a system of removing a film material and particles left at the periphery of a semiconductor wafer, and in particular, to a plasma etching chamber capable of completely removing a film material and particles left and deposited at the periphery of the dry etched wafer during plasma etching, and a plasma etching system using the same.

(b) Description of Related Art

For the fabrication of an integrated circuit, thin film process and dry etching process are very important but the film material is unnecessarily deposited at the periphery of the wafer during the thin film process, and in addition, with the dry cleaning of the top surface of the wafer through plasma etching, the by-product generated during the plasma etching is not completely exhausted, but deposited throughout the top, the lateral and the bottom sides of the periphery of the wafer as particles.

That is, with the plasma-etched wafer, as shown in FIG. 12, particles 93 are deposited at the peripheral end of the wafer 91 continuously from the top thereof to the bottom through the lateral side, and intruded to the gap between the wafer 91 and a stage 95.

The periphery of the wafer is not used to form a semiconductor chip, but the film material and the particles left thereat (referred to hereinafter as the "particles") cause serious damages to the semiconductor chips during the subsequent semiconductor processing steps.

The particles deposited at the peripheral end of the wafer may be removed through wet cleaning, but the wet cleaning is liable to induce other device failures with the cleaned semiconductor. The remnant solution remained after the cleaning has a high reactivity as an environmentally bad polluting material, and hence, it is difficult to waste-dispose the solution.

Japanese Patent Laid-open Publication No. Hei07-142449 discloses a device for plasma etching to remove the particles left at the peripheral end of the wafer.

With the disclosed etching device, a reaction gas is blown to the space between top and bottom electrodes arranged corresponding to the periphery of the wafer to make the plasma etching, and an inert gas is blown to the center of the top electrode to prevent the generated plasma from being intruded to the wafer.

However, as the above device has a structure of applying radio frequency to the top electrode facing the wafer while not applying the self bias to the wafer, it involves slow etching speed and long processing time.

Moreover, the etching is performed only with respect to the top surface of the periphery of the wafer so that the particles deposited throughout the lateral to the bottom sides thereof cannot be completely removed.

SUMMARY OF THE INVENTION

It is an object of the present invention to provide a plasma etching chamber which continuously and completely etches the top, the lateral and the bottom sides of the periphery of the wafer when it is intended to remove the particles deposited at the peripheral end of the wafer through plasma etching.

It is another object of the present invention to provide a plasma etching system which introduces a new plasma etching chamber with the semiconductor production process, and processes a large number of wafers within a short period of time for the better throughput.

These and other objects may be achieved by a plasma etching chamber with the following features.

According to one aspect of the present invention, the plasma etching chamber includes a cathode for applying radio frequency to a wafer through a built-in stage, a ring-shaped bottom anode placed at the outer circumference of the stage while being positioned below the periphery of the wafer, and a ring-shaped top anode placed over the stage while facing the ring-shaped bottom anode. The discharge is created between the peripheral end of the wafer and the ring-shaped top anode as well as between the peripheral end of the wafer and the ring-shaped bottom anode while generating plasma to continuously etch the top to the bottom sides of the periphery of the wafer.

According to another aspect of the present invention, the etching chamber includes a stage mounted with a wafer, a ring-shaped top anode and a ring-shaped bottom cathode placed around the periphery of the wafer while facing each other and a view-ring placed at the outer circumference of the ring-shaped top anode while limiting the plasma space. With this structure, the pressure distribution of the reaction gas flown between the ring-shaped top anode and the ring-shaped bottom cathode is controlled such that the plasma generated due to the discharge effectively etches the top to the bottom sides of the periphery of the wafer.

With the plasma etching chamber according to the present invention, a groove may be formed at a disk-shaped insulator placed over the stage and facing it while extending parallel to the wafer to form the etching boundary with a vertical shape.

With the plasma etching chamber according to the present invention, the center of the insulator placed over the wafer while facing it may be formed with a concave surface to inhibit the discharge there around.

The plasma etching chamber according to the present invention may further include means for stably mounting the wafer onto the stage, or laser sensor for measuring the discharge distance between the top surface of the wafer and the ring-shaped top anode and controlling it to be at an optimum value, thereby conducting the wafer etching optimally.

The plasma etching chamber according to the present invention may further include an aligner for correcting the posture of the wafer mounted on the stage.

According to still another aspect of the present invention, with the plasma etching system, when wafer-loaded cassettes are fed to any one of plural numbers of cassette stands, a handler takes the wafers from the stands, and brings them to a wafer alignment unit. When the wafers are posture-corrected at the orientation frat (OF) locations thereof, the handler takes the wafers from the wafer alignment unit, and moves them into plasma etching chambers. When the etching of the wafers is completed, the handler takes the wafers from the chambers, and loads them to the initial cassettes.

According to still another aspect of the present invention, with the plasma etching system, when wafer-loaded cassettes are fed to load ports, a subsidiary handler takes the wafers from the load ports, and brings them to a wafer alignment unit to posture-correct the OF locations thereof. When the posture-corrected wafers are temporarily loaded into load lock chambers, a handler takes the wafers from the load lock chambers, and moves them into any one of plural numbers of etching chambers. When the etching of the wafers is completed, the handler takes the wafers from the chambers, and moves them into load lock chambers. The subsidiary handler takes the wafers from the load lock chambers, and returns them to the initial cassettes.

BRIEF DESCRIPTION OF THE DRAWINGS

The above and other advantages of the present invention will become more apparent by describing preferred embodiments thereof in detail with reference to the accompanying drawings in which.

DETAILED DESCRIPTION OF PREFERRED EMBODIMENTS

Preferred embodiments of the present invention will be now explained to make easy understanding of the advantages and the merits thereof.

Figure 1:
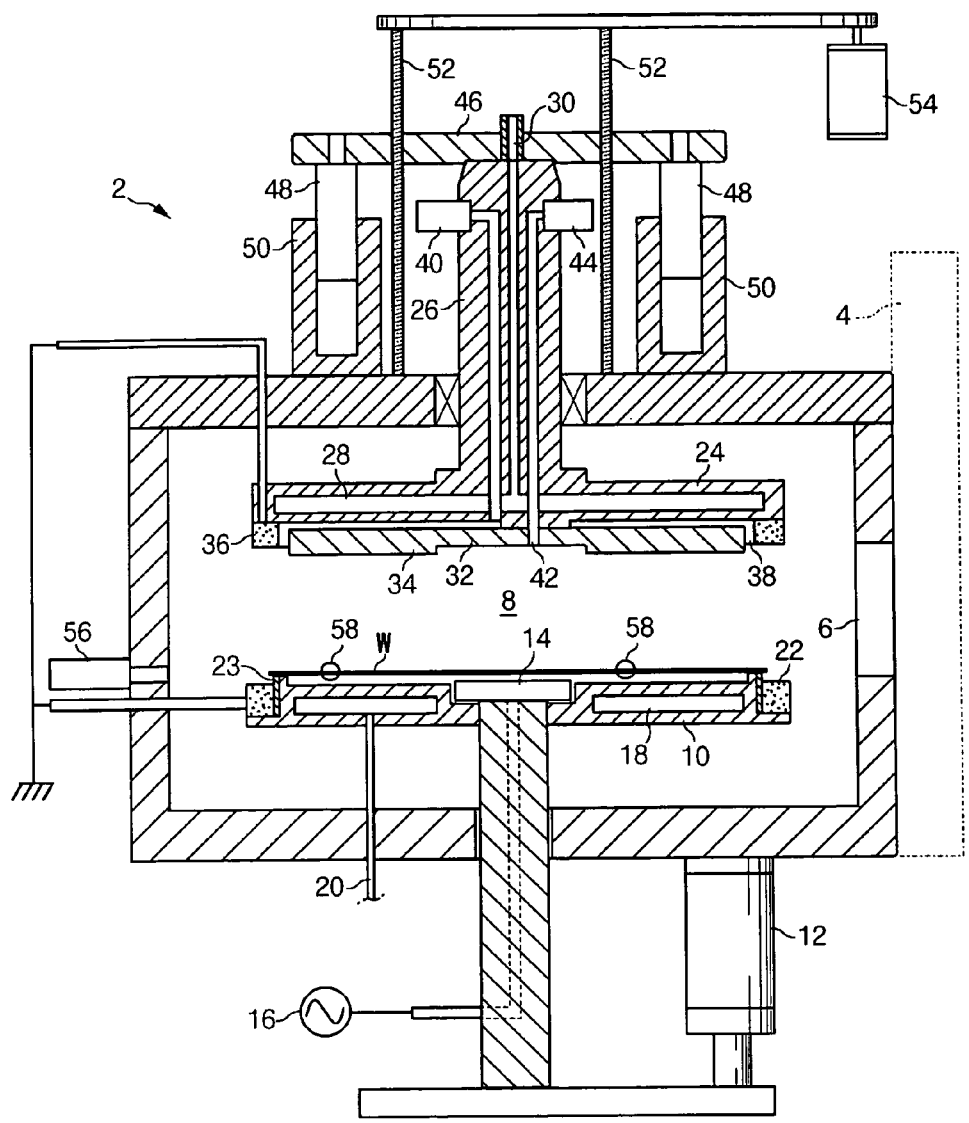
FIG. 1 is a side elevation view of a plasma etching chamber according to an embodiment of the present invention.

FIG. 1 illustrates the structure of an etching chamber according to an embodiment of the present invention.

As shown in FIG. 1, the chamber 2 has an inner space 8 isolated from the outside by closing a door 4 of a gate 6 through which a wafer W goes in or out. A stage 10 is placed at the center of the inner space 8 to mount the wafer W thereon.

With the isolation of the inner space 8 from the outside, the atmosphere thereof is controlled to be under the low pressure of about $10^{-1}$-$10^{-3}$ Torr.

A cathode 14 is placed at the center of the top surface of the stage 10 such that it can be elevated by an actuator 12, and connected to a plasma oscillator 16. A water jacket 18 is provided within the stage 10 to forcefully cool it such that a coolant can be circulated via at least two paths 20 communicated with the outside. A ring-shaped bottom anode 22 is attached to the outer circumference of the stage 10 by interposing an insulating material 23.

The cathode 14 receives the wafer W from the top, and descends to a predetermined location to mount it on the stage 10.

At this time, the ring-shaped bottom anode 22 should be positioned lower than the wafer W such that a predetermined distance is made between the anode 22 and the periphery of the wafer W mounted on the stage 10 to allow the discharge.

Figure 2:
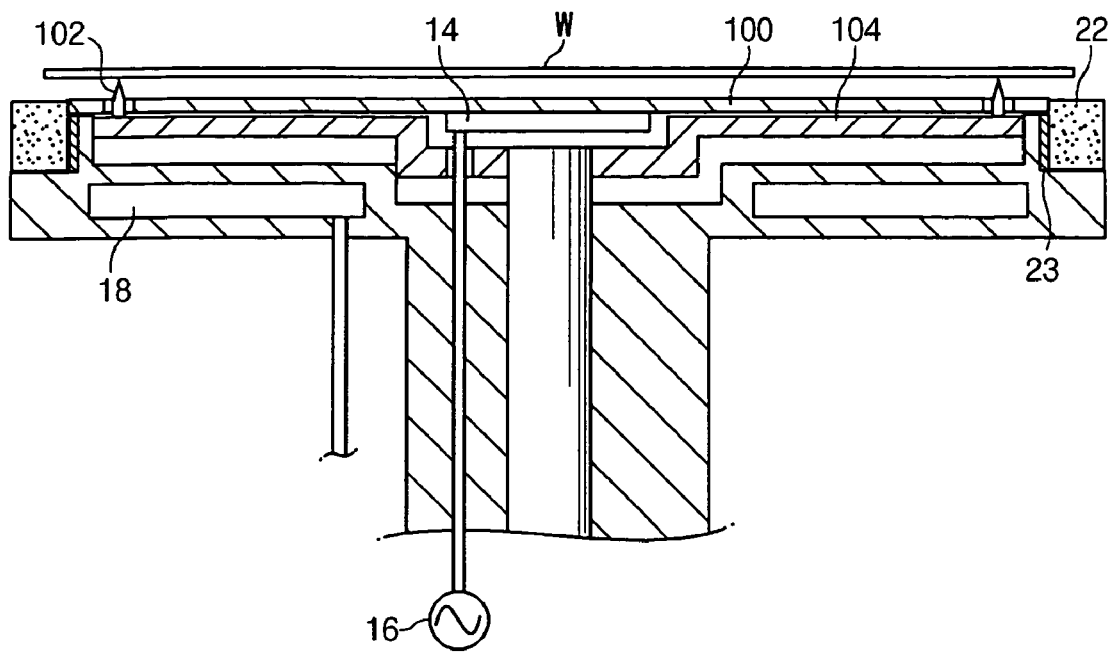
FIG. 2 is a partial side elevation view of the plasma etching chamber shown in FIG. 1, illustrating a variant of a stage mounted within the chamber.

With the etching chamber according to the embodiment of the present invention, it is more preferable that the stage 10 has the structure shown in FIG. 2.

As shown in FIG. 2, an insulating plate 100 with a cathode 14 is placed on the stage 10, and a plate 104 with at least three pins 102 is placed under the insulating plate 104. The pin 102 penetrates through the insulating plate 100 while being protruded to the top. The plate 104 is connected to an actuator 12 such that it can be elevated. The cathode 14 is located at the center of the bottom surface of the insulating plate 100.

With the above structure, the bottom surface of the wafer W is supported by the pins 102 protruded over the stage 10, and when the actuator 12 descends, the wafer W is mounted onto the insulating plate 100 without shaking.

As shown in FIG. 1, a stem 24 is placed over the stage 10 with almost the same area such that it can move up and down by way of a rod 26 extended upward. Furthermore, as like with the stage 10, a water jacket 28 is provided within the stem 24 such that a coolant is circulated via a path 30 communicated with the inner space of the rod 26.

An insulator 34 is attached to the bottom surface of the stem 24, and has a concave surface 32 with a predetermined radius at the center thereof. A ring-shaped top anode 36 is mounted around the insulator 34 while facing the bottom anode 22. The top and the bottom anodes 36 and 22 are all earthed to the ground.

Meanwhile, in case the thickness of the insulator 34 is too thin, the discharge is liable to be made over the entire area thereof while generating plasma at the center of the wafer W, thereby making unnecessary etching. With the present invention, as the center of the insulator 34 is spaced apart from the top surface of the wafer W with a larger distance due to the presence of the concave portion 32, the strength of the electric field at that area becomes weak, and the discharge is not made at the concave portion 32.

However, the relation between the thickness of the insulator 34 and the discharge should not be disregarded. It was confirmed through experiments that when the thickness of the insulator 34 is less than 15 mm and the discharge is stably made at the periphery thereof, the discharge was also made at the center thereof even with the presence of the concave portion 32.

In this connection, the thickness of the insulator 34 is preferably established to be 15 mm or more.

Meanwhile, a ring-shaped reaction gas outlet 38 is placed between the insulator 34 and the top anode 36, and opens to blow the reaction gas injected through a first tube passage 40 to the periphery of the wafer W. A nitrogen gas outlet 42 is placed at the central concave portion 32 of the insulator 34, and opens to blow the nitrogen gas fed through a second tube passage 44 to the center of the wafer W. The rod 26 with the first and the second tube passages 40 and 44 is connected to post bars 48 at its outer ends by mediating a horizontal bar 46, and the post bars 48 are axially supported by guiders 50 provided at the outer top surface of the chamber 2 such that they move up and down without shaking. The elevation of the rod 26 is made by ball screws 52 and a stepping motor 54 in synchronization with the horizontal bar 46.

With the etching chamber according to the embodiment of the present invention, it is more preferable that a laser sensor 56 is provided at the outer circumference of the chamber 2 to measure the gap between the wafer W and the top anode 36 and feedback the measurement result to a controller, thereby controlling the descending location of the stem 24 correctly.

Furthermore, with the etching chamber according to the embodiment of the present invention, it is more preferable that a plurality of radial direction-controlling aligners 58 is equidistantly arranged around the top surface of the stage 10 in the space 8.

Figure 3:
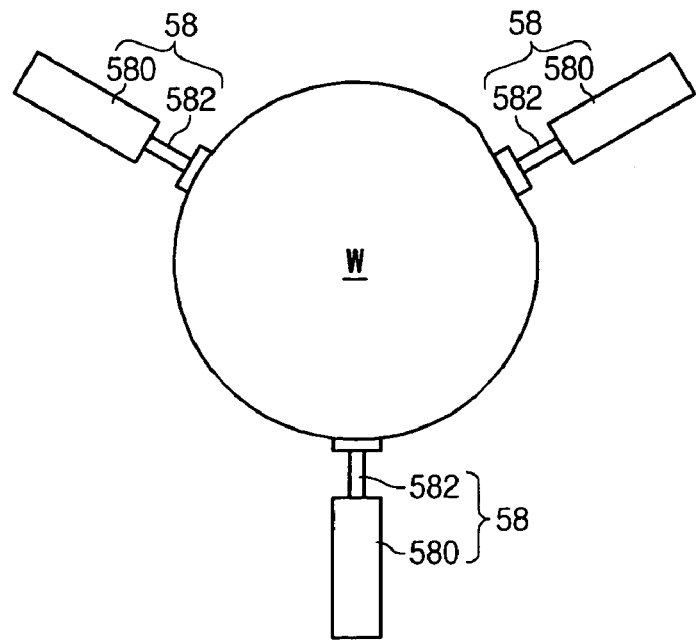
FIG. 3 is a plan view of the plasma etching chamber shown in FIG. 1, illustrating the alignment of the center of a wafer by an aligner placed near to the stage in the chamber.

As shown in FIG. 3, the aligners 58 are formed each with a piston rod 582 moving forward and backward by way of a cylinder 580. The piston rods 582 are elongated all with the same length while slightly holding or pressing the periphery of the wafer W to align the center thereof. In this way, the wafer W is corrected to its proper posture, and finally, the orientation frat (OF) locations thereof agree to each other.

With the etching chamber according to the embodiment of the present invention, as the top and the bottom portions of the peripheral end of the wafer W are spaced apart from the top and the bottom anodes 36 and 22 with a predetermined distance, the plasma may be generated only at those portions.

That is, the nitrogen gas blown through the nitrogen gas outlet 42 makes formation of an air curtain at the center of the wafer W, and prevents the reaction radicals generated at the periphery of the wafer W during the etching from flowing to the center thereof.

Meanwhile, as the reaction gas blown through the reaction gas outlet 38, such as argon, $CF_4$ and $SF_6$, pervades to the periphery of the wafer W, the plasma is generated only at the periphery thereof.

Figure 4:
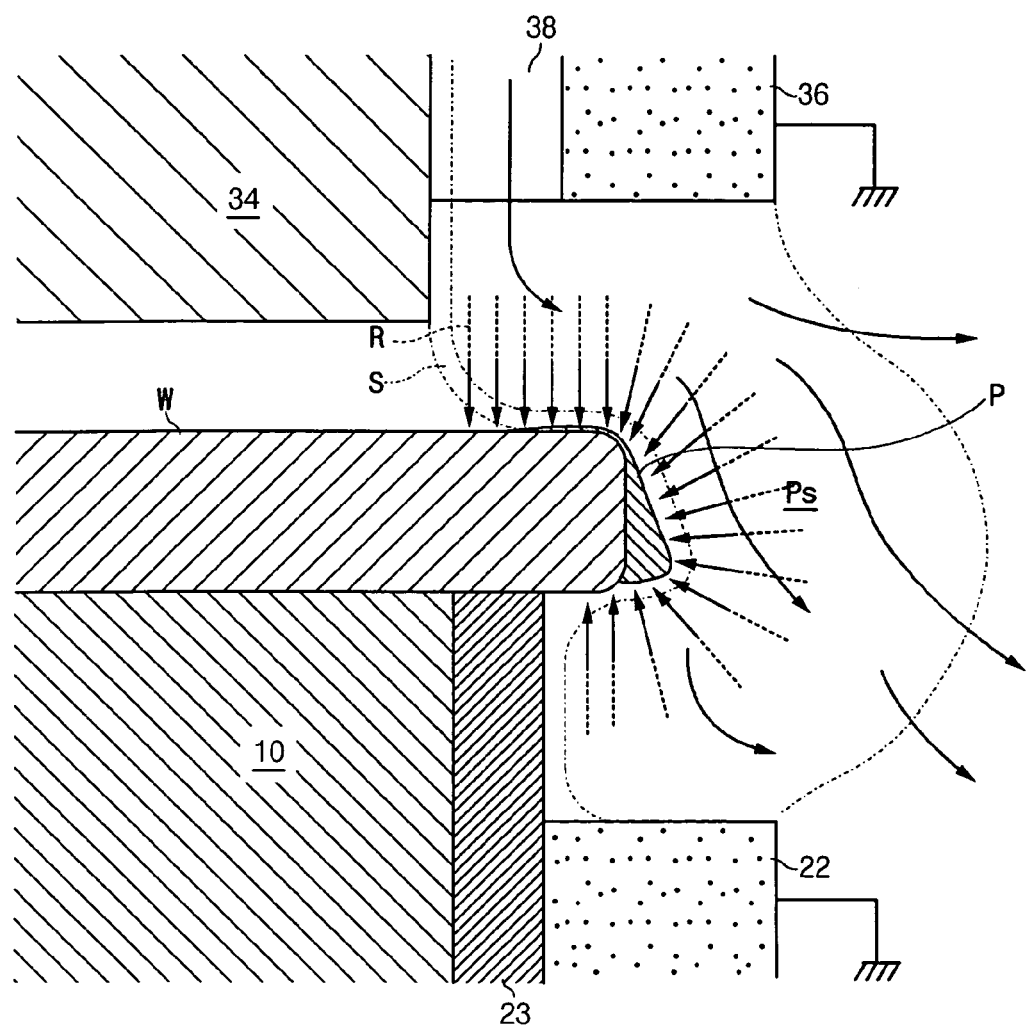
FIG. 4 is a partial amplified sectional view of an etching chamber according to an embodiment of the present invention, illustrating the process of etching the peripheral end of a wafer.

When radio frequency is applied to the cathode 14, as shown in FIG. 4, the reaction gas blown through the reaction gas outlet 38, more specifically, $CF_4$ is ionized due to the discharge made only at the periphery of the wafer W, and in this condition, the dissociation reaction of $CF_4 \to CF_3 + F^*$ or $CF_4 \to CF_2 + 2F^*$ is made. The neutral F radicals R collide against the peripheral surface of the wafer W, and react with the particles deposited thereon to thereby form volatile compounds. In this way, the etching is made, and at the same time, the reaction gas is continuously flown in the direction of the arrow of the drawing.

When the plasma Ps is generated by the reaction gas, a space charge sheath S supervening to the gas ionization is formed therein. Any discharge is not made at the space charge sheath S, the plasma is not generated. Accordingly, as the neutral F radical R is not generated, the etching at the space charge sheath S is not made.

Meanwhile, the thickness of the space charge sheath S may be minimized by controlling the vacuum degree of the chamber 2 and the radio frequency oscillating degree in such a way as to not hinder the plasma etching, but the influence thereof cannot be completely removed.

Figure 5:
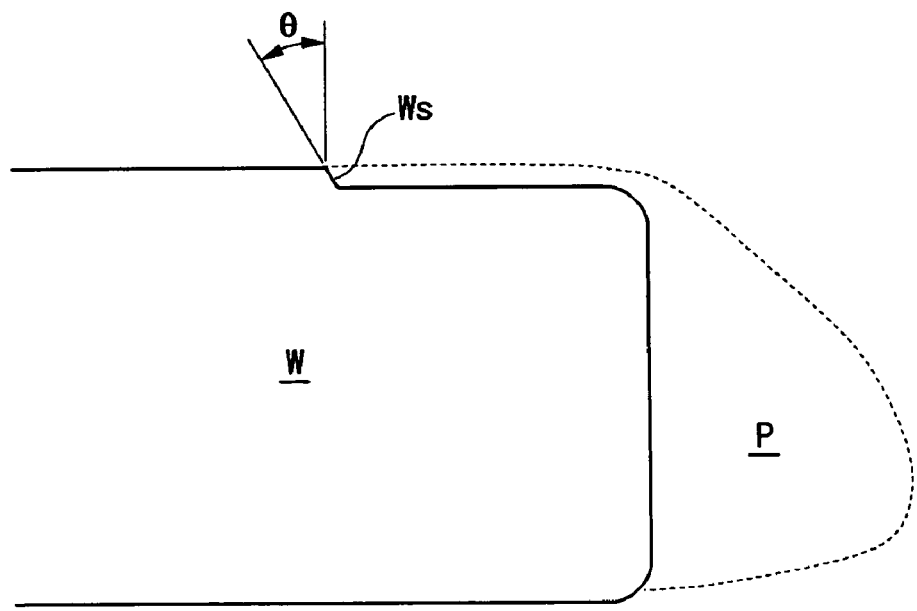
FIG. 5 is an amplified side view of the periphery of a wafer, illustrating the result of the etching process illustrated in FIG. 4.

FIG. 5 illustrates the result of etching the periphery of a wafer W using the etching chamber according to the embodiment of the present invention.

The etching boundary at the peripheral end of the wafer W is formed with an inclined side Ws with an etching angle θ due to the influence of the space charge sheath S. The etched area and the particles P deposited at the end thereof are indicated by the dotted line.

Practically, even if the thickness of the space charge sheath S is controlled to be minimized, the etching angle θ reaches 2-3°, at which the wafer device is not damaged.

Figure 6:
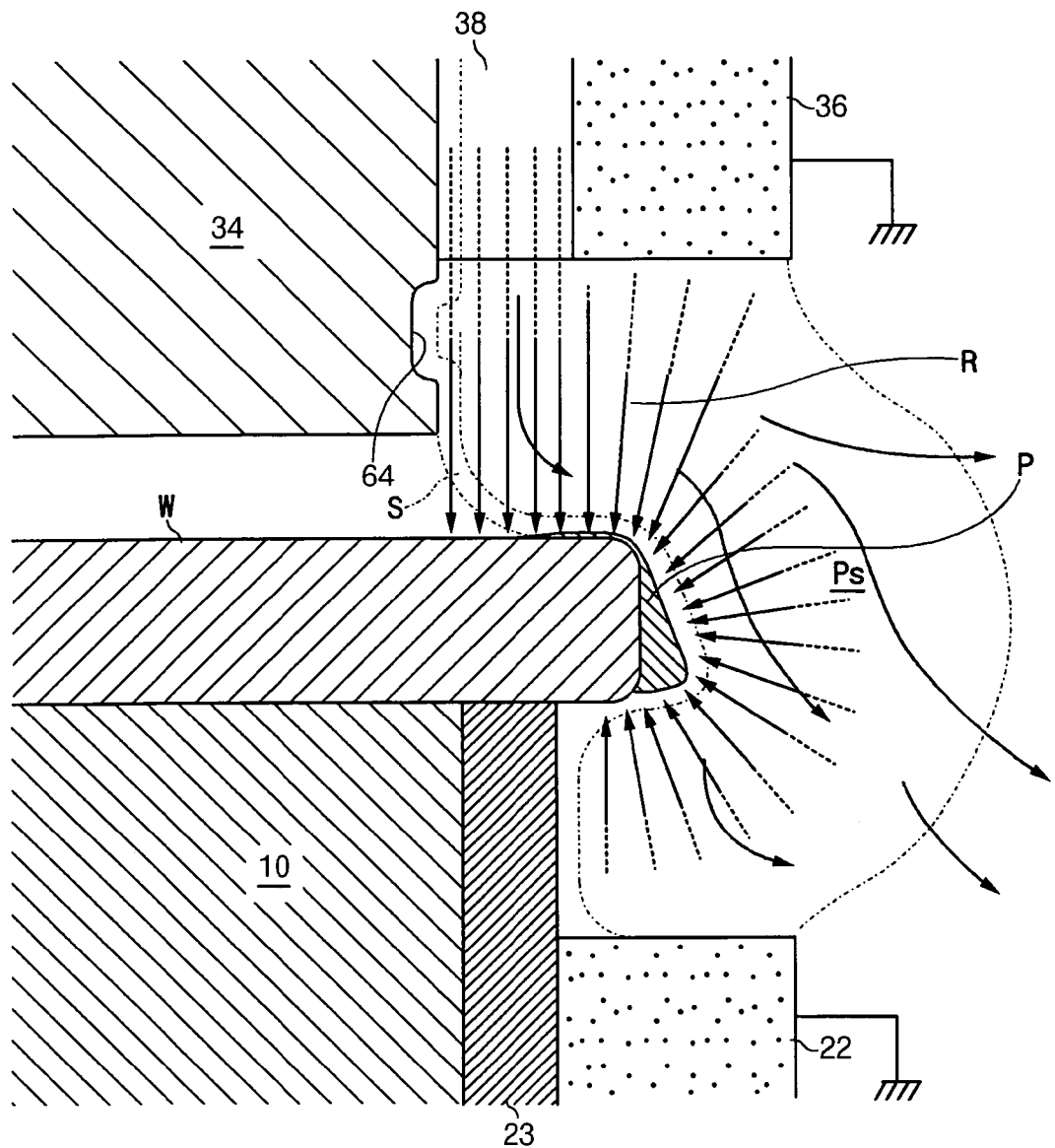
FIG. 6 is an amplified sectional view of the etching chamber illustrating the shape of the plasma varied due to the variation in the top-sided insulator, corresponding to the illustration of FIG. 4.

In order to approximate the etching angle θ to zero, as shown in FIG. 6, a groove 64 is formed at the outer circumference of the insulator 34 parallel to the wafer W.

Figure 7:
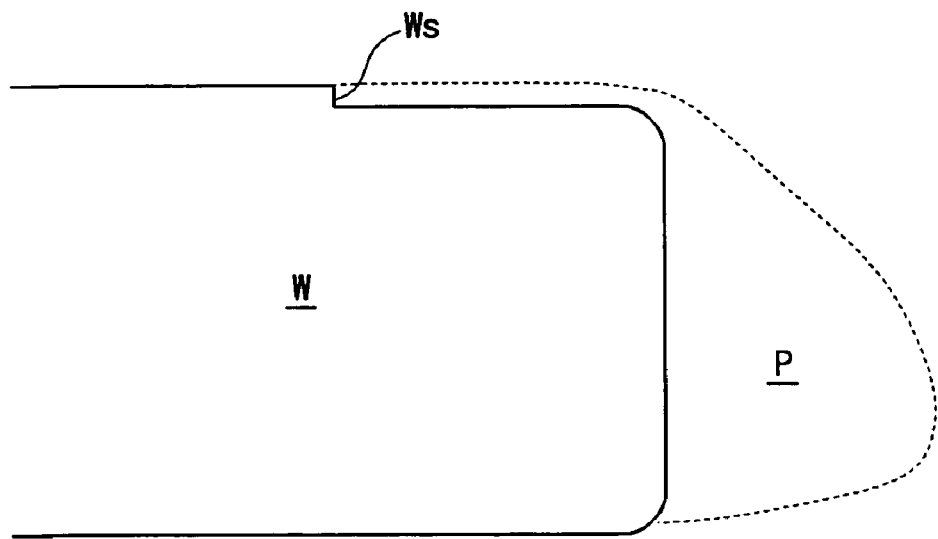
FIG. 7 is a side view of the periphery of the wafer etched with the structure shown in FIG. 6, corresponding to the illustration of FIG. 5.

With the formation of the groove 64 at the insulator 34, as shown in the drawing, the reaction gas ridden along the outer circumference thereof meets the inner circumference of the groove 64, and is inflected along the groove 64 so that the plasma is diffused while generating neutral F radicals R. The neutral F radicals R transmit the lower-sided space charge sheath S, and collide against the wafer W perpendicular to the surface thereof. Consequently, as shown in FIG. 7, an optimum etching shape is made such that the etching boundary is nearly vertical to the periphery of the wafer W while being positioned slightly internal to the end thereof.

Practically, it turned out that the optimum depth D of the groove 64 was 1.8 mm.

The above-described structure according to the embodiment of the present invention includes the components of a cathode 14 and a pair of anodes 22 and 36, but the present invention is not limited thereto.

Figure 8:
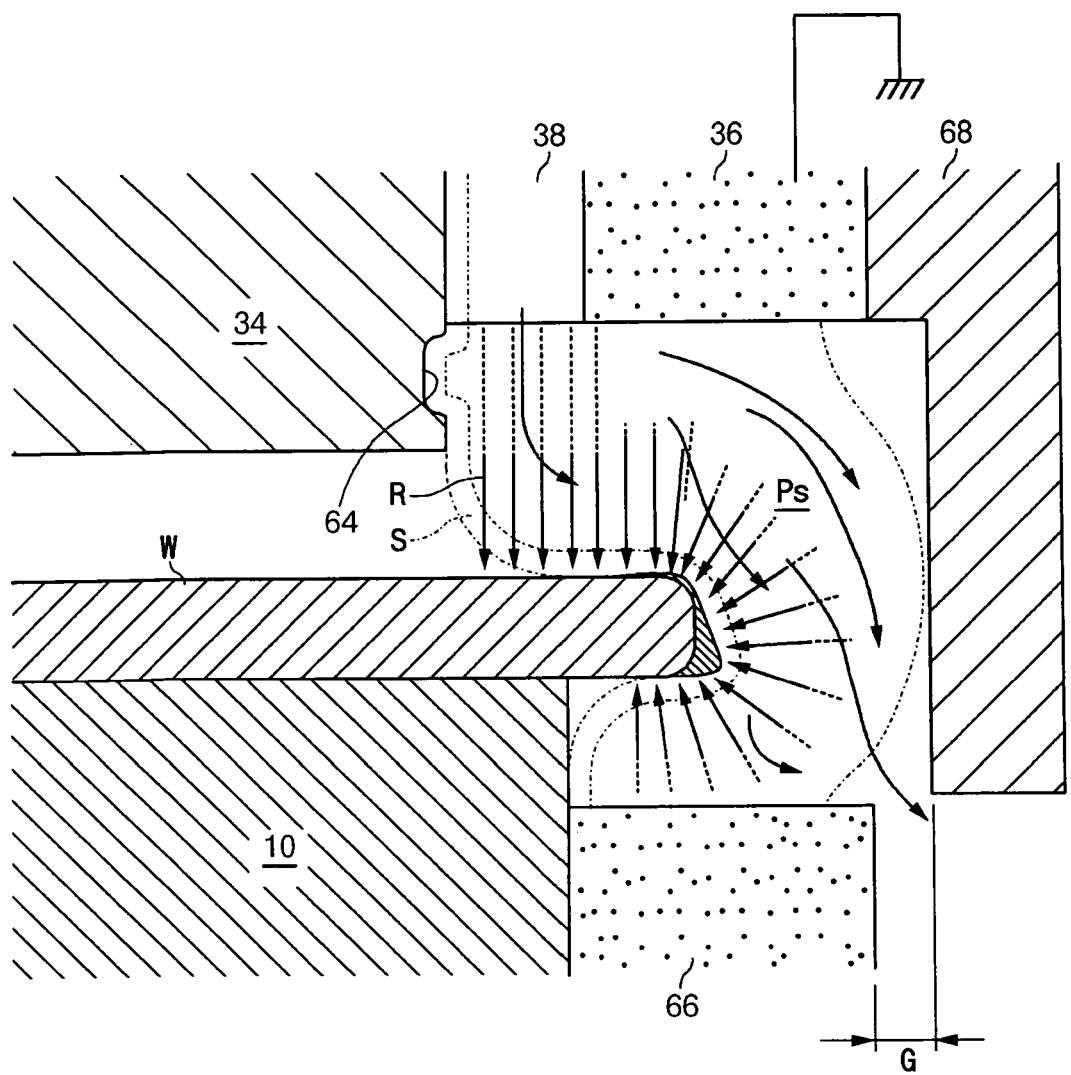
FIG. 8 is an amplified sectional view of an etching chamber according to another embodiment of the present invention, illustrating the process of etching a wafer in correspondence with the illustration of FIG. 4.

FIG. 8 illustrates an etching chamber according to another embodiment of the present invention where the same components as those with the etching chamber according to the previous embodiment are indicated by like reference numerals.

In this embodiment, a ring-shaped bottom cathode 66 is attached to the outer circumference of a stage 10 instead of the ring-shaped bottom anode 22, and connected to a plasma oscillator 16. A view-ring 68 is attached external to a top anode 36 to inhibit the diffusion of the reaction gas.

The view-ring 68 mechanically shields the ring-shaped anode 36 and the bottom cathode 66 such that the reaction gas is converged without diffusing to the outside, and flown via the bottom surface of the periphery of the wafer W. In this way, the plasma Ps is sufficiently generated throughout the top to the bottom sides of the wafer W.

With the structure having the view-ring 68, the flow pressure of the reaction gas can be controlled by properly establishing the distance G between the inner circumference of the viewing 68 and the outer circumference of the ring-shaped cathode 66. In this structure, the plasma can be generated even with a lower power by limiting the plasma-generated region.

Even in this embodiment, a groove 64 may be formed at the outer circumference of the insulator 34 for the same purpose as with the previous embodiment.

Figure 9:
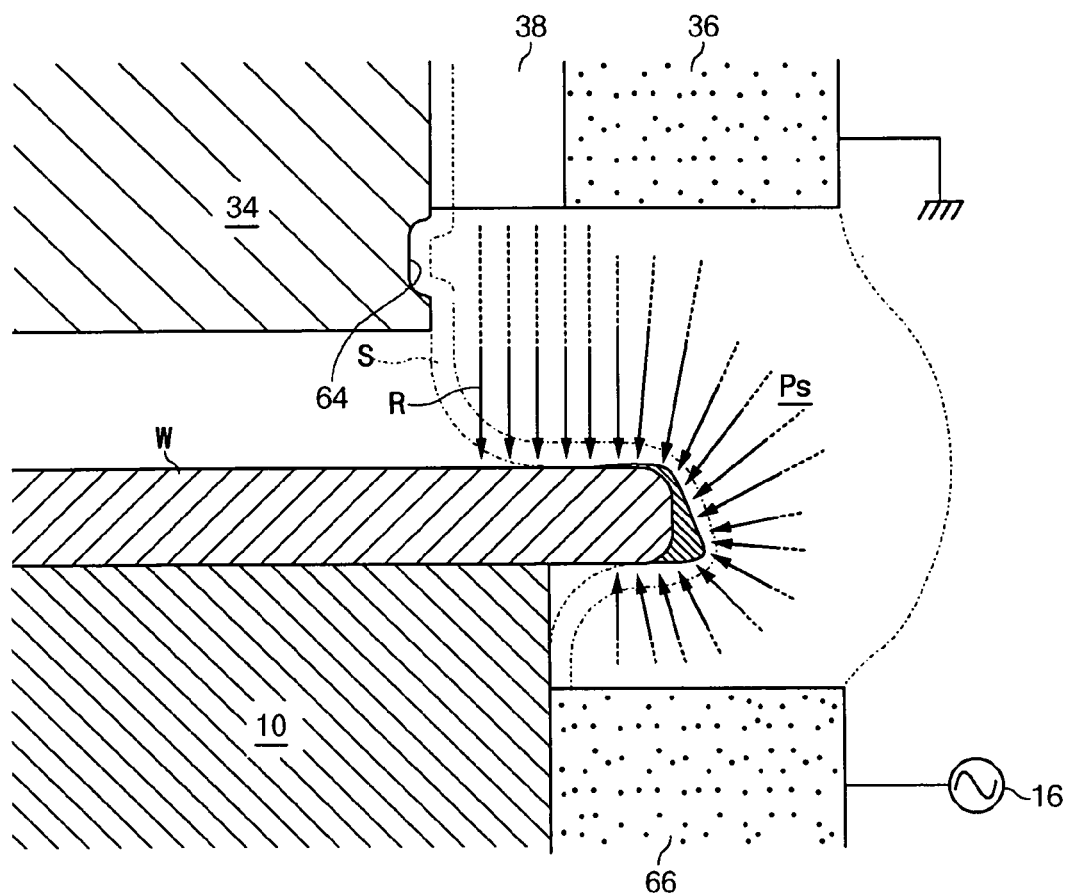
FIG. 9 is a variant of the etching chamber shown in FIG. 8, illustrating the process of etching a wafer in correspondence with the illustration of FIG. 4.

As shown in FIG. 9, the groove 64 is formed at the outer circumference of the insulator 34 with the omission of the view-ring 68, thereby achieving the desired etching function.

When the discharge is made between the ring-shaped top anode 36 and the ring-shaped bottom cathode 66 facing each other to thereby generate the plasma Ps, the reaction gas flown through the reaction gas outlet 38 is diffused while making a weak flow so that the etching for the peripheral end of the wafer W may be insufficient. However, the optimum etching region based on the point of infection of the space charge sheath S induced by the groove 64 agrees to the peripheral end of the wafer W to thereby etch the peripheral end of the wafer W in a desired manner.

With the above-structured etching chamber according to the embodiment of the present invention, the plasma-induced heat may be highly generated during the dry cleaning process, but the stage 10 and the stem 24 have a cooling structure to dissipate such a heat. In this case, de-ionized water (ultra pure water) is preferably used as a coolant.

With the embodiments illustrated in FIGS. 8 and 9, the structural components shown in FIGS. 2 and 3 may be further provided.

Figure 10:
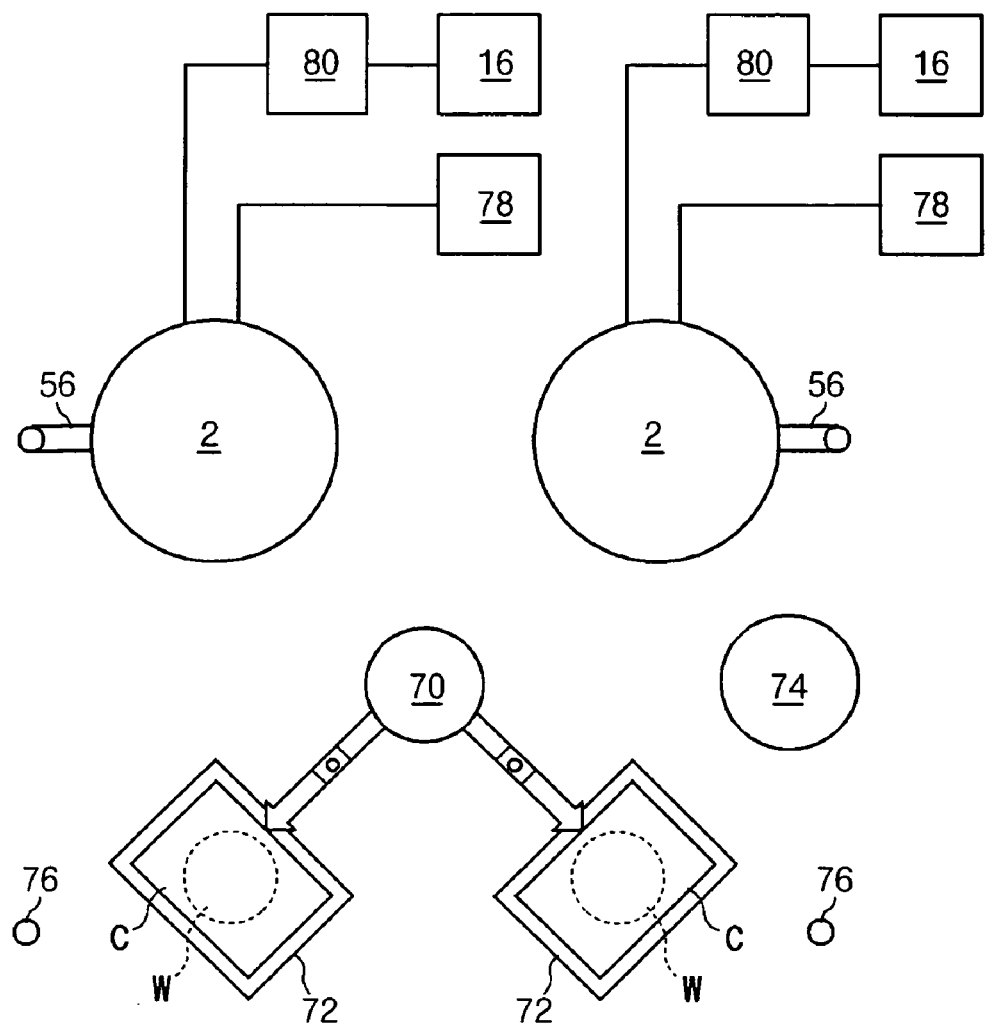
FIG. 10 is a schematic structural view of an etching system according to an embodiment of the present invention.

An etching system with the structure shown in FIG. 10 may be realized using the etching chamber according to the embodiment of the present invention.

As shown in FIG. 10, the etching system includes a plurality of chambers 2, and a handler 70 placed front to the chambers 2. A plurality of cassette stands 72 and a wafer alignment unit 74 are placed around the handler 70. Wafers W are mounted at a cassette C, and delivered to any one of the cassette stands 72.

In this case, the cassette stand 72 is preferably rotated at a predetermined angle with a driving member controlled by a sensor (not shown) such that the handler 70 takes the wafers W from the cassette C with balanced posture.

A non-safety area is established around the cassette stands 72, and a body sensor 76 is provided there. When the worker body partially enters the non-safety area during the driving of the handler 70, the body sensor 76 senses it, and stops the operation of the handler 70.

The handler 70 takes wafers W from the cassette C, and brings them to the wafer alignment unit 74. The wafer alignment unit 74 is rotated at a predetermined angle by the driving member, and aligns the wafers W to the inlets of the chambers 2, that is, the OF locations.

The wafers W aligned by the wafer alignment unit 74 are taken by the handler 70, and charged into the chambers 2 through the gates 6 thereof, followed by mounting them onto the stages 10.

The wafers W mounted on the stage 10 is finally aligned to the OF location by the aligner 58, and when the door 4 of the gate 6 closes, the inner space 8 of the chamber 2 is isolated from the outside while being kept to be in a vacuum state. Thereafter, the top-sided stem 24 descends such that it is located over the wafer W by a predetermined height.

The descending of the stem 24 is measured by a laser sensor 56, and the distance between the stem 24 and the wafer W is controlled to be optimal for the etching. When the stem 24 goes too far, the operation of the stem 24 is stopped while issuing a warning or alarm signal.

When the stem 24 descends to a predetermined location, a nonvolatile gas and a reaction gas are fed to the wafer W from the outside so that the peripheral end of the wafer W is etched.

When the etching is terminated, the stem 24 ascends to return to the initial location, and the door 4 opens. The handler 70 recovers the etched wafer W, and loads it onto the cassette C. The recovered wafers W are delivered to the location for the subsequent process.

The testing of the non-defective or the defective of the wafers W is conducted through the way of usual samplings.

The reference numeral 78 of FIG. 10 indicates a refrigerator for supplying a coolant to the chamber 2 and circulating it, and the reference numeral 80 indicates a power matcher disposed between the chamber 2 and the plasma oscillator 16. The refrigerator 78 and the power matcher 80 are provided per each chamber 2. Alternatively, they may be common to all of the chambers 2 as a single unit.

Figure 11:
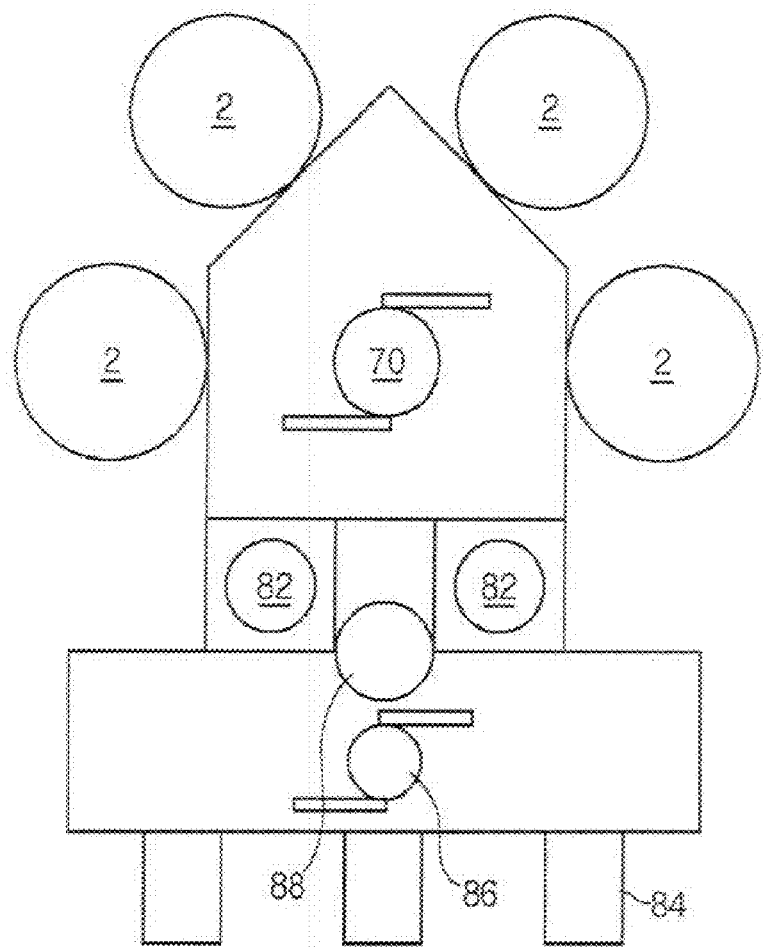
FIG. 11 is a schematic structural view of an etching system according to another embodiment of the present invention.
Figure 12:
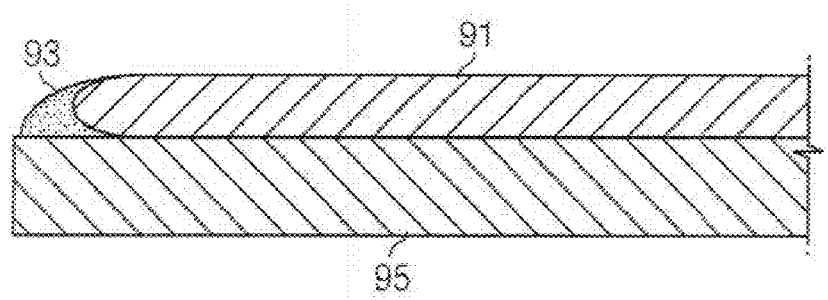
FIG. 12 is a partial amplified view of a wafer with the deposited particles at the peripheral end thereof, plasma-etched according to a prior art.

FIG. 11 illustrates an etching system according to another embodiment of the present invention. As shown in FIG. 11, a plurality of chambers 2 are arranged around the handler 70, and a plurality of load lock chambers 82 are provided at the inlet and the outlet of the handler 70. A plurality of load ports 84 are continuously arranged close to the load lock chambers 82. The wafers W are delivered between the load lock chambers 82 and the load ports 84 by way of a subsidiary handler 86, and before they are charged into the load lock chambers 82, they are corrected in their postures by an aligner 88.

With the system according to the embodiment of the present invention, the charging, taking out and the posture correction of the wafer W are conducted by the handler and the aligner as like with the previous embodiment, but a large number of chambers 2 may be arranged, and the dry cleaning of the wafer may be automatically conducted by the collective process of sequential controlling.

With the inventive process of dry-etching the particles deposited at the peripheral end of the wafer during the dry cleaning process, the top, the lateral and the bottom sides of the periphery of the wafer are etched with a single process, or the peripheral end of the wafer is correctly etched.

Accordingly, the target portion of the periphery of the wafer can be etched within a short period of time, and the processing efficiency per the unit time is heightened. This serves to reduce the production cost of the semiconductor device. In addition, with the omission of the conventional wet cleaning, the processing steps can be simplified.

Although preferred embodiments of the present invention have been described in detail hereinabove, it should be clearly understood that many variations and/or modifications of the basic inventive concept herein taught which may appear to those skilled in the art will still fall within the spirit and scope of the present invention, as defined in the appended claims.

What is claimed is:

1. A plasma etching chamber for etching only the periphery of a wafer by mounting the wafer on a stage such that the periphery of the wafer is positioned between ring-shaped top and bottom electrodes, blowing a nitrogen gas to the center of the wafer through the center of a top-sided stem while making a non-discharged region, and blowing a reaction gas to the periphery of the stem to make a gas discharge, the plasma etching chamber comprising:
    a cathode mounted within the stage to apply radio frequency to the wafer;
    a ring-shaped bottom anode placed at the outer circumference of the stage while being positioned lower than the periphery of the wafer;
    a stem installed over the stage such that the stem moves up and down;
    insulator having an annular groove formed in a side wall of an outer side periphery of the concave portion being formed at the center of the bottom surface of the stem while facing the top surface of the stage, the insulator having an annular groove formed in a side wall of an outer side periphery of the insulator, the groove extending parallel to the wafer and making a point of inflection in the flow of the reaction gas along the outer side periphery of the insulator; and
    a ring-shaped top anode placed at the outer circumference of the insulator while interposing a reaction gas outlet such that a plasma is generated between the periphery of the wafer and the ring-shaped top and bottom anodes.

2. The plasma etching chamber of claim 1 wherein the thickness of the insulator is established to be 15 mm or more.

3. The plasma etching chamber of claim 1 further comprising an insulating plate covering the top surface of the stage, at least three vertical pins protruding from the bottom of the insulating plate to the top thereof, and a plate for elevating the vertical pins.

4. The plasma etching chamber of claim 1 further comprising a laser sensor for measuring the distance between the ring-shaped top anode and the top surface of the wafer.

5. The apparatus of claim 1 in which the plasma etching chamber further comprises aligners for controlling the radial direction of the wafer with cylinders equidistantly arranged around the stage and piston rods elongated with the same length while slightly holding or pressing the periphery of the wafer to align the center thereof and provided per the respective cylinders.

6. The apparatus of claim 1 in which the plasma etching chamber comprises aligners having piston rods that extend in directions parallel to a surface of the wafer to press the periphery of the wafer to align the wafer.

7. A plasma etching chamber for etching only the periphery of a wafer by mounting the wafer on a stage such that the periphery of the wafer is positioned between ring-shaped top and bottom electrodes, blowing a nitrogen gas to the center of the wafer through the center of a top-sided stem while making a non-discharged region, and blowing a reaction gas to the periphery of the stem to make a gas discharge, the plasma etching chamber comprising:
   a ring-shaped cathode mounted within the chamber;
   an insulator attached to the bottom surface of the stem internally placed at the top of the chamber and having a concave portion for preventing the discharge at the center of the wafer, the insulator having a annular groove formed in a side wall of an outer side periphery of the insulator, the groove extending parallel to the wafer and making a point of inflection in the flow of the reaction gas along the outer side periphery of the insulator;
   a ring-shaped anode placed at the periphery of the insulator while facing the ring-shaped cathode, a plasma being generated between the anode and the cathode; and
   a view-ring placed at the outer periphery of the ring-shaped anode to make a distance for controlling the flow path of the reaction gas between the ring-shaped cathode and the ring-shaped anode.

8. The plasma etching chamber of claim 7 wherein the depth of the groove is established to be 1.8 mm.

9. The plasma etching chamber of claim 7 wherein the thickness of the insulator is established to be 15 mm or more.

10. The plasma etching chamber of claim 7 further comprising an insulating plate covering the top surface of the stage, at least three vertical pins protruding from the bottom of the insulating plate to the top thereof, and a plate for elevating the vertical pins.

11. The plasma etching chamber of claim 7 further comprising a laser sensor for measuring the distance between the ring-shaped top anode and the top surface of the wafer.

12. The apparatus of claim 7 in which the plasma etching chamber further comprises aligners for controlling the radial direction of the wafer with cylinders equidistantly arranged around the stage and piston rods elongated with the same length while slightly holding or pressing the periphery of the wafer to align the center thereof and provided per the respective cylinders.

13. The apparatus of claim 7 in which the plasma etching chamber comprises aligners having piston rods that extend in directions parallel to a surface of the wafer to press the periphery of the wafer to align the wafer.

14. An apparatus comprising:
    a plasma etching chamber for etching only the periphery of a wafer, the plasma etching chamber comprising:
       a stage to support a wafer;
       a cathode to provide a radio frequency signal to the wafer;
       a ring-shaped bottom anode placed at an outer circumference of the stage;
       a disk-shaped insulator positioned above the wafer, the insulator having an annular groove formed in a side wall of an outer side periphery of the insulator, the annular groove extending parallel to the wafer; and
       a ring-shaped top anode placed at an outer circumference of the insulator, the top anode being spaced apart from the outer periphery of the insulator to provide a reaction gas outlet that provides reaction gas to the periphery of the wafer, the annular groove of the insulator causing a point of inflection in a flow of the reaction gas along the outer periphery of the insulator.

15. The apparatus of claim 14 in which the gas outlet comprises a ring-shaped outlet.

16. The apparatus of claim 14 in which the periphery of the insulator extends closer to the wafer than a lower surface of the top anode and the annular groove is positioned closer to the wafer than the lower surface of the top anode as determined along a direction perpendicular to a surface of the wafer.

17. The apparatus of claim 14 in which the side wall of the outer side periphery of the insulator is perpendicular to a surface of the wafer.

18. The apparatus of claim 14 in which the insulator has a concave portion for preventing discharge at a center of the wafer.

19. The apparatus of claim 14 in which discharge between the periphery of the wafer and the top and bottom anodes causes a plasma to be generated between the periphery of the wafer and the ring-shaped top and bottom anodes.

20. The apparatus of claim 14 in which the plasma etching chamber comprises aligners having piston rods that extend in directions parallel to a surface of the wafer to press the periphery of the wafer to align the wafer.

* * * * *

UNITED STATES PATENT AND TRADEMARK OFFICE
CERTIFICATE OF CORRECTION

PATENT NO. : 7,615,131 B2
APPLICATION NO. : 10/514609
DATED : November 10, 2009
INVENTOR(S) : Lim It is certified that error appears in the above-identified patent and that said Letters Patent is hereby corrected as shown below:

On page 1, column 1, please replace the title of the patent with the following corrected title:

Item (54) & Col. 1 lines 1-2

PLASMA ETCHING CHAMBER AND PLASMA ETCHING SYSTEM ~~USING SAME~~ THEREWITH

On page 1, column 2, under the heading "FOREIGN PATENT DOCUMENTS" please replace the prior art reference with the following corrected version:

EP      0 810 614    ~~5/1997~~ 12/1997

In column 8, lines 28-55, please replace claim 1 with the following corrected version:

1. A plasma etching chamber for etching only the periphery of a wafer by mounting the wafer on a stage such that the periphery of the wafer is positioned between ring-shaped top and bottom electrodes, blowing a nitrogen gas to the center of the wafer through the center of a top-sided stem while making a non-discharged region, and blowing a reaction gas to the periphery of the stem to make a gas discharge, the plasma etching chamber comprising:
    a cathode mounted within the stage to apply radio frequency to the wafer;
    a ring-shaped bottom anode placed at the outer circumference of the stage while being positioned lower than the periphery of the wafer;
    a stem installed over the stage such that the stem moves up and down;
    an insulator ~~having an annular groove formed in~~ attached to the bottom surface of the stem with a ~~side wall of an outer side periphery of~~ concave portion, the concave portion being formed at the center of the bottom surface of the stem while facing the top surface of the stage, the insulator having an annular groove formed in a side wall of an outer side periphery of the insulator, the groove extending parallel to the wafer and making a point of inflection in the flow of the reaction gas along the outer side periphery of the insulator; and
    a ring-shaped top anode placed at the outer circumference of the insulator while interposing a reaction gas outlet such that a plasma is generated between the periphery of the wafer and the ring-shaped top and bottom anodes.

In column 9, line 22, please delete "a" and insert --an-- therefor.

Signed and Sealed this

Sixteenth Day of March, 2010

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,615,131 B2 | Page 1 of 1 |
| APPLICATION NO. | : 10/514609 | |
| DATED | : November 10, 2009 | |
| INVENTOR(S) | : Dong-Soo Lim | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 563 days.

Signed and Sealed this

Twenty-third Day of November, 2010

David J. Kappos
*Director of the United States Patent and Trademark Office*